United States Patent [19]

Dhurjaty

[11] Patent Number: 5,081,631
[45] Date of Patent: Jan. 14, 1992

[54] DIRECT MODULATION OF LASER DIODES FOR RADIOGRAPHIC PRINTERS

[75] Inventor: Sreeram Dhurjaty, Rochester, N.Y.
[73] Assignee: Eastman Kodak Company, Rochester, N.Y.
[21] Appl. No.: 679,964
[22] Filed: Apr. 3, 1991
[51] Int. Cl.⁵ .............................................. H01S 3/00
[52] U.S. Cl. ....................................... 372/38; 372/26; 372/29; 372/9; 372/8
[58] Field of Search ................... 372/38, 9, 26, 29, 28, 372/8; 455/613, 618

[56] References Cited

U.S. PATENT DOCUMENTS

| | | | |
|---|---|---|---|
| 4,774,710 | 9/1988 | Davis et al. | 372/9 |
| 4,890,288 | 12/1989 | Inuyanna et al. | 372/38 |
| 4,899,348 | 2/1990 | Kiya et al. | 372/9 |
| 5,001,717 | 3/1991 | Mayer et al. | 372/38 |

*Primary Examiner*—Georgia Epps
*Attorney, Agent, or Firm*—William F. Noval

[57] ABSTRACT

A radiographic printer has a laser diode light source which is directly modulated by an input image signal. The laser diode has two operating regions, a linear laser region and a non-linear low-level light emitting region. The laser diode is amplitude modulated in the lasing region and is pulse width modulated in the light emitting region. A programmable digital delay produces the pulse width modulating signal and a digital comparator determines whether the laser diode operates in the amplitude modulation mode or the pulse width modulation mode. A current steering circuit is used in the pulse width modulation mode to rapidly switch the diode on and off. In addition, programmable digital to analog converters are used to compensate for changes in different diode slope efficiencies and threshold currents.

5 Claims, 3 Drawing Sheets

DIRECT MODULATION OF LASER DIODES FOR RADIOGRAPHIC PRINTERS

TECHNICAL FIELD

The present invention pertains to apparatus and methods for controlling a laser diode so that an illuminative output of the diode changes in a linear manner in response to changing input signals.

BACKGROUND ART

The laser diode has been used frequently as a light source in a variety of photographic applications. For example, in the field of laser printing, a laser beam is focused through a lens and then scanned onto a negative film. The diode is often controlled by digital image data stored in a computer. In some systems, the laser is operated so that it is completely on or off, thereby generating either black or white pixels to form an image in response to the image signals. However, image quality may be improved by forming the image from pixels having varying gray tones, more specifically, when gradations in intensities of the gray levels is such that the transitions between pixels appear relatively smooth. This is referred to as a continuous tone image. The continuous tone radiographic laser printer is one application in which a laser diode is used to expose radiographic film to electronic images produced by medical imaging modalities such as computed tomography, magnetic resonance imaging, digital subtraction angiography, ultrasound imaging, and the like.

A problem with laser diodes is that the illuminative output of a semiconductor laser diode is not linear across its entire operating range. More specifically, FIG. 1 is a typical graph of light output as a function of current through the laser diode. The resulting curve has a lower level non-linear operating region joined by a knee region to a higher level operating region where light output varies linearly as a function of the voltage differential (current). The linear region is called the lasing region, and the non-linear, lower level region is known as the light emitting or spontaneous emission region. The curve includes a lower portion between 0 and the knee current $I_k$ where the resulting optical power output $P_d$ varies in a non-linear manner as current $I_d$ changes and a second higher portion between $I_k$ and I maximum current, $I_{max}$, where optical power output varies linearly with changes in current $I_d$. In the non-linear region of the curve below $I_k$, a constant current increment along the X axis generates a non-constant increment in optical power output along the Y axis. The non-linear region is unsatisfactory for generating a continuous tone image in response to image input signal levels ranging from a zero output level (corresponding to maximum film density) and a maximum signal level (corresponding to minimum film density).

In order to address this problem, commonly assigned U.S. Pat. No. 4,774,710, issued Sept. 27, 1988, entitled APPARATUS AND METHOD FOR CONTROLLING A LASER DIODE TO GENERATE A LINEAR ILLUMINATIVE OUTPUT, discloses the direct modulation of a laser diode in which the diode is amplitude modulated in the linear lasing region and is pulse width modulated in the non-linear light emitting region.

SUMMARY OF THE INVENTION

According to an aspect of the present invention, there is provided a control circuit for directly modulating a laser diode wherein amplitude modulation is effected in the lasing region of the laser diode and pulse width modulation is effected in the light emitting region of the laser diode. A current steering circuit is provided to effect high speed modulation of the diode when operating in the pulse width modulation mode. According to another aspect of the present invention, direct modulation of the laser diode is accomplished with a prespecified number of bits (up to 12) at rates up to 4 megapixels per second. According to a further aspect of the present invention, pulse width modulation of the diode with a ratio of 32:1 in any given pixel is possible so that the minimum pulse width at 4 megapixels per second is in the order of 8 nanoseconds. According to a further feature of the present invention, programmable means are provided to compensate for slope changes in the laser diode as well as to compensate for threshold current changes.

BRIEF DESCRIPTION OF THE DRAWING

In a detailed description of the preferred embodiments of the invention presented below, reference is made to the accompanying drawings in which like numerals refer to like elements.

DETAILED DESCRIPTION OF PREFERRED EMBODIMENTS

Figure 2:
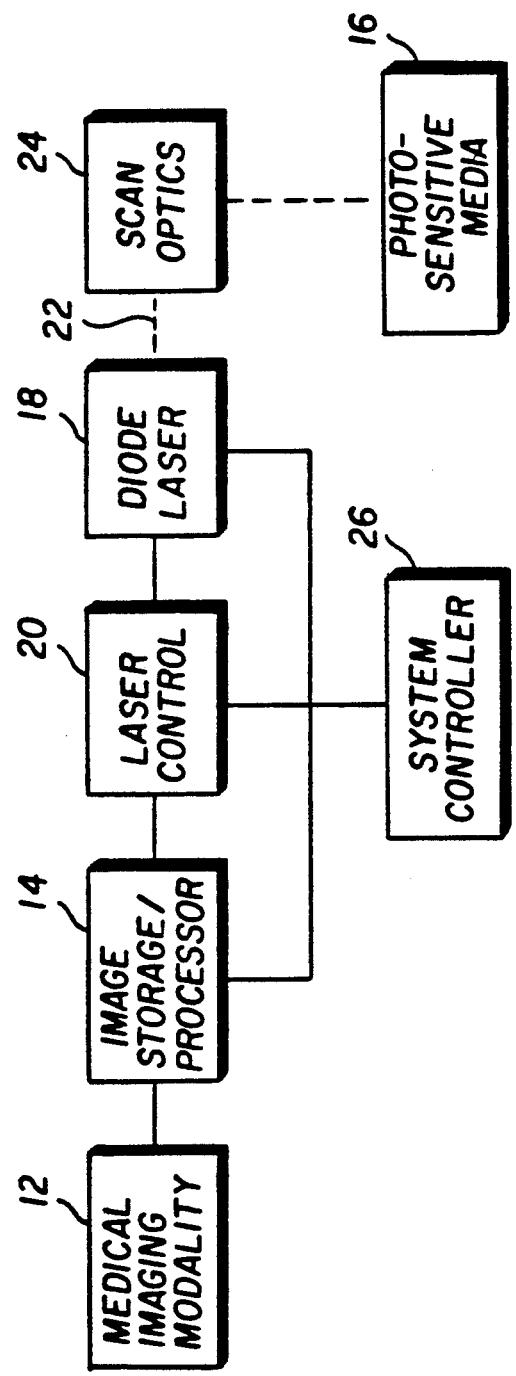
FIG. 2 is a simplified block diagram of an imaging system incorporating a conventional injection laser diode, as well as the control circuitry of the present invention.

Referring now to FIG. 2, there is shown a medical imaging system incorporating an embodiment of the present invention. As shown, system 10 includes a source of a digital medical diagnostic image such as is produced by medical imaging modality 12. Modality 12 may, for example, be a diagnostic imaging modality, such as computed tomography modality, magnetic resonance imaging modality, ultrasound modality, digital subtraction angiography modality, or the like. The digital image can also be produced from a storage phosphor, a digitized radiograph or from a digital image archive or storage system. The image produced by modality 12 is digitized and stored in image storage/processor 14. The digital image may be stored in a magnetic or optical disk drive provided in processor 14. The digital image may also be processed by well-known techniques, such as window width/level, tonal gradation, interpolation, edge enhancement, or the like.

A hard copy of the digital image is produced on photosensitive media 16 by means of a diode laser 18 which is controlled by laser control circuit 20, according to the present invention. The laser beam 22 produced by diode laser 18 is shaped and scanned by means of scan optics 24 to produce a visual image of the digital image on photosensitive media 16 which may, for example, be film, paper or the like.

System 10 includes system controller 26 which controls processor 14, laser control circuit 20, diode laser 18 and scan optics 24. Controller 26 includes a well-known digital computer such as a microprocessor for effecting control of the different components of system 10.

Figure 1:
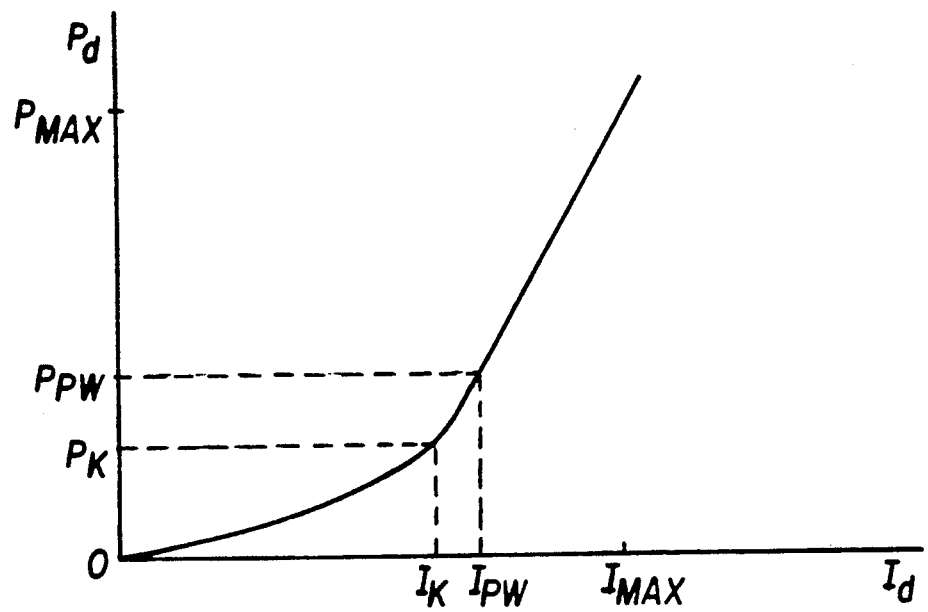
FIG. 1 is a graph of a laser diode operating curve in which illuminative output power P is a function of current I through the diode.
Figure 4:
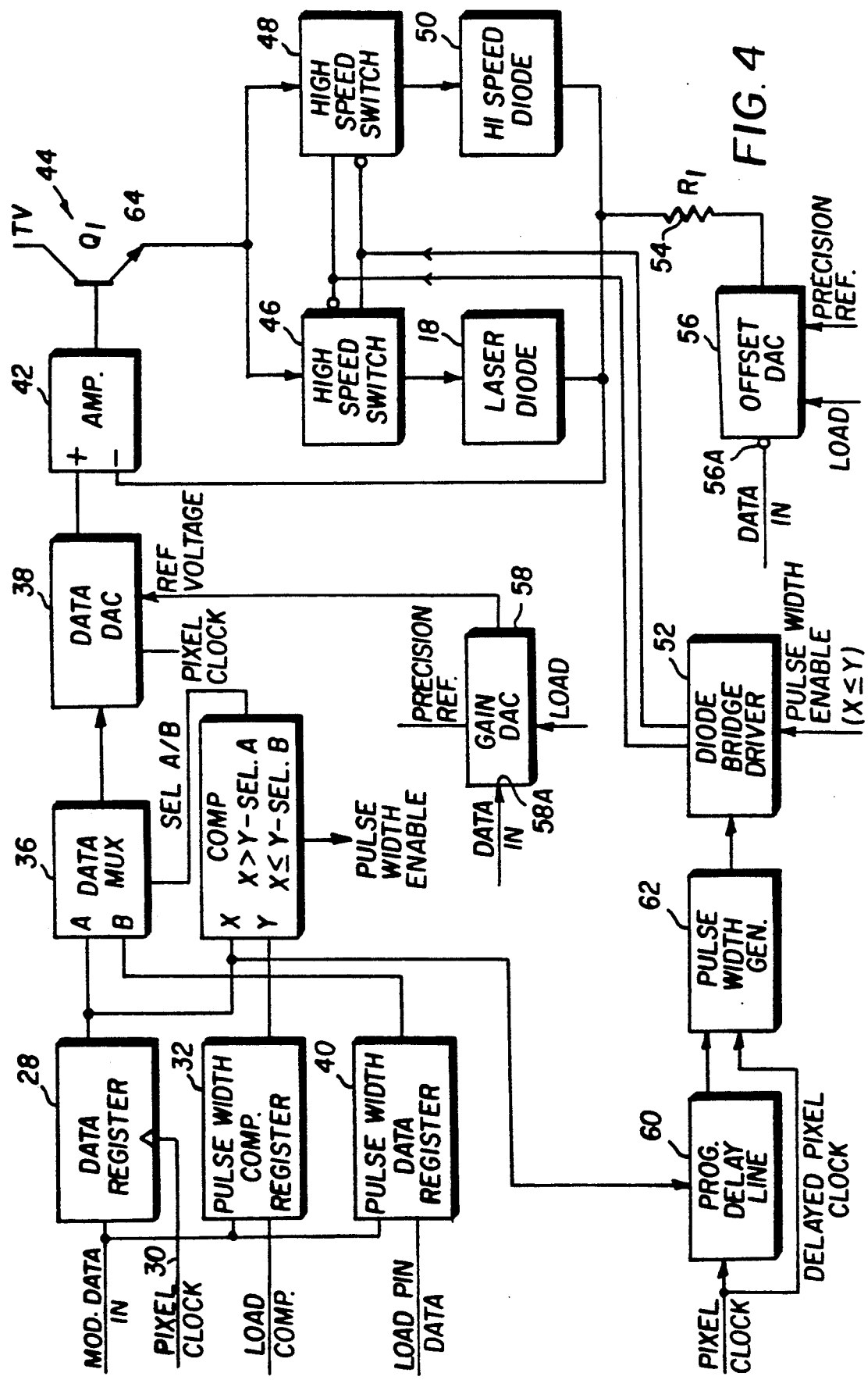
FIG. 4 is a more detailed diagram of the laser diode control circuit of FIG. 2.

According to the present invention, diode laser 18 is operated in a amplitude modulation mode in the linear lasing region of the diode laser and in a pulse width modulation mode in the lower level light-emitting region of the diode laser. Referring to FIG. 4, there is shown a preferred embodiment of the laser control circuit of the present invention for effecting operation of diode laser 18 in its alternate modes. As shown, laser control circuit 20 includes a data register 28 for storing the pixel data which is to modulate laser diode 18. The data is strobed into register 28 at the rising edge of the pixel clock applied over line 30. As illustrated, the pixel depth is 12 bits. In order to determine whether laser diode 18 is operated in the amplitude modulation mode above the knee of its operating curve (FIG. 1) or in the pulse width modulation mode below the knee of its operation curve, a pulse width comparison register 32 is loaded with a 12 bit word which corresponds to the knee of the diode laser operating curve. As shown in FIG. 1, the digital image value corresponding to current $I_k$ is taken as the transition point between the operating modes and a 12 bit digital word is loaded into register 32.

Comparator 34 compares the 12 bit data word stored in data register 28 and the 12 bit data word loaded in register 32 to determine whether the data word is greater than, equal to or less than the transition word. If the data word is greater than the transition point word, then the laser diode is operated in the amplitude modulation mode in the linear lasing operating region of the laser diode 18. A signal is provided to data MUX 36 to strobe the data word in register 28 to the input of data digital to analog converter (DAC) 38 at the rising edge of the next pixel clock.

If the value of the data word contained in data register 28 is less than or equal to the transition point word loaded in pulse width comparator register 32, then comparator 34 produces a pulse width modulation enable signal which causes a pulse width data signal stored in register 40 to be applied to DAC 38 by MUX 36. The value of the pulse width data word is such as to cause the operation of the laser diode 18 in the linear region above $I_k$. Such a point, for example, may be at $I_{pw}$.

When laser diode 18 is operating in the pulse width modulation mode, a constant value signal is produced, but has a variable pulse width which is a function of the digital data word representing the pixel brightness.

In either mode, DAC 38 converts the digital image signal into an analog voltage which is applied to op-/amp 42. Op/amp 42 controls transistor 44 which converts the voltage image signal into a current image signal for driving laser diode 18.

A current steering circuit 45 includes laser diode 18 in series with a first high speed switch 46 and in parallel with a second high speed switch 48 which is in series with high speed diode 50. Switches 46 and 48 are controlled by diode bridge driver 52 which is enabled by a pulse width enable signal from comparator 34. A resistor 54 and an offset DAC 56 are in series with the transistor 44 and the current steering circuit 45.

A programmable gain DAC 58 is provided to control the gain of data DAC 38 to compensate for different slope efficiencies of different laser diodes or for changes in slope efficiencies due to aging or temperature changes.

A pulse width modulation circuit includes programmable delay line 60 and pulse width generator 62.

According to the present invention, the operation of the laser diode control circuit shown in FIG. 4 is as follows. The modulation data of an image signal pixel is loaded into data register 28 and compared with the threshold point data loaded into pulse width comparison register 32. If comparator 34 determines that the data in register 28 is greater than the data in register 32, comparator 34 causes data MUX 36 to transfer the contents of register 28 to data DAC 38 to convert the digital pixel value to an analog voltage which is applied to transistor 44 by means of op/amp 42. As long as the pixel value loaded into register 28 is larger than the pulse width data value loaded into register 32, laser diode 18 is operated in the linear lasing region of the laser operation curve in an amplitude modulation mode. Diode bridge driver 52 turns switch 46 on and switch 48 off so that current flowing through transistor 44 flows through switch 46, laser diode 18, and resistor 54. The optical output of laser diode 18 is linearly related to the input signal from processor 14.

Figure 3:
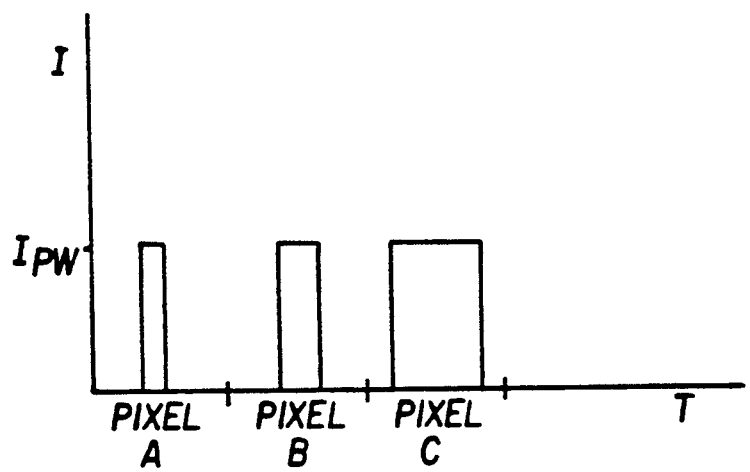
FIG. 3 is a graph useful in illustrating the pulse width modulation mode of operation.

When the pixel digital value loaded into data register 28 is less than or equal to the pulse width comparator register data (such that the laser diode would operate in the non-linear light emitting region of its operating curve), comparator 34 enables data MUX 36 to transfer the data word loaded into pulse width data register 40 to data DAC 38. This is a constant value and equals a current $I_{pw}$ which is located in the linear region of the laser diode operating curve (FIG. 1). A pulse width is generated by the programmable delay line 60 and pulse width generator 62. As the value of the data word contained in data register 28 increases, the width of the pulse generated will increase. As shown in FIG. 3, the current values for the pulses of pixels A, B and C are the same, but the pulse widths change as the value of the data word increases from pixel A to pixel C.

The diode bridge driver 52 turns switches 46 and 48 on and off to steer current through laser diode 18 during the pulse width period and through high speed diode 50 during the period when laser diode 18 is off. Rapidly switching current between diodes 18 and 50 results in pulse widths as low as 60 nanoseconds to be achieved. By turning switches 46 and 48 on and off rapidly, current steering of the emitter currents of transistor 44 is generated by maintaining the output voltage at the emitter 64 of transistor 44 as a constant. The use of the switches in a closed feedback loop of amplifier 42 contributes to the precision of the pulse amplitude.

The reference voltage of data DAC 38 is set by gain DAC 58 which is programmable by receiving data in at input terminal 58A from system controller 26. Thus, compensation of different slope efficiencies of the operating curves of the same or different laser diodes may be effected. The current through resistor 54, due to feedback around op/amp 42, is equal to the voltage at the output of data DAC 38 minus the voltage at the output of offset DAC 56. Offset DAC 56 is used to compensate for changes in the lasing threshold current of different laser diodes. A programmable data word is input from system controller 26 at input terminal 56A of DAC 56.

TECHNICAL ADVANTAGE

The laser diode and control circuit therefore of the present invention finds commercial utility in applications in which a digital image signal is used to drive a laser diode to expose a photosensitive media to produce a hard copy output of the digital image. One application is to make a hard copy radiographic film image of a digital image produced by a medical diagnostic imaging modality.

The invention has been described in detail with particular reference to certain preferred embodiments thereof, but it will be understood that variations and modifications can be effected within the spirit and scope of the invention.

What is claimed is:

1. Laser imaging apparatus comprising:
   (a) a laser diode having a linear laser operating region and a non-linear light emitting region;
   (b) means for applying a digital image signal to directly modulate said laser diode;
   (c) control circuit means for applying said input signal to said laser diode to operate said laser diode in an amplitude modulation mode in the linear laser region of said diode when the input digital image signal is above a predetermined value, and in a pulse width modulation mode in which said laser diode is operated in said linear region with a pulse width which is determined by said input digital signal level when said input digital signal is equal to or below said predetermined value; and
   (d) said control circuit means including current steering circuit means for enabling rapid switching of said laser diode on and off in said pulse width modulation mode.

2. The apparatus of claim 1, including programmable means for compensating for different diode operating slope efficiencies and different laser diode threshold currents.

3. The apparatus of claim 1 wherein said current steering circuit means includes a source of laser driving current and means for rapidly switching said laser driving current between said laser diode and a parallel current path, when said laser diode is operated in said pulse width modulation mode.

4. The apparatus of claim 2 including data digital to analog conversion means for converting a digital image signal into an analog image signal for driving said laser diode and wherein said programmable means includes a gain digital-to-analog converter connected to said data conversion means for programmably changing the gain of said gain conversion means to compensate for different operating slope characteristics.

5. The apparatus of claim 4 wherein said programmable means includes an offset digital-to-analog converter connected to said current steering circuit means for programmably compensating for different threshold currents.

* * * * *